(12) United States Patent
Iwata

(10) Patent No.: US 9,734,984 B2
(45) Date of Patent: Aug. 15, 2017

(54) MULTI-BEAM CURRENT QUANTITY MEASURING METHOD, MULTI-CHARGED PARTICLE DRAWING CONTROL DEVICE, AND MULTI-CHARGED PARTICLE BEAM DRAWING DEVICE

(71) Applicant: NUFLARE TECHNOLOGY, INC., Yokohama-shi (JP)

(72) Inventor: Hideyuki Iwata, Narita (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/001,717

(22) Filed: Jan. 20, 2016

(65) Prior Publication Data

US 2016/0211114 A1 Jul. 21, 2016

(30) Foreign Application Priority Data

Jan. 21, 2015 (JP) .................. 2015-009481

(51) Int. Cl.
*H01J 37/244* (2006.01)
*H01J 37/317* (2006.01)
*H01J 37/24* (2006.01)
*G01R 19/00* (2006.01)

(52) U.S. Cl.
CPC ........ *H01J 37/243* (2013.01); *G01R 19/0061* (2013.01); *H01J 37/3177* (2013.01); *H01J 2237/2443* (2013.01)

(58) Field of Classification Search
CPC .... H01J 37/243; H01J 37/3177; H01J 37/244; G01R 19/0061

USPC ... 250/492.1, 492.2, 492.21, 492.22, 492.23, 250/492.3, 396 R, 397
See application file for complete search history.

(56) References Cited

U.S. PATENT DOCUMENTS

| | | | |
|---|---|---|---|
| 2004/0207415 A1* | 10/2004 | Yamada | G01R 31/307 324/750.16 |
| 2013/0253688 A1* | 9/2013 | Matsumoto | H01L 21/02675 700/121 |
| 2013/0316288 A1* | 11/2013 | Nakayamada | G03F 7/2061 430/296 |

FOREIGN PATENT DOCUMENTS

JP 2013-197468 9/2013

* cited by examiner

*Primary Examiner* — Nicole Ippolito
(74) *Attorney, Agent, or Firm* — Oblon, McClelland, Maier & Neustadt, L.L.P.

(57) ABSTRACT

A current quantity measuring method of multi-beams irradiates with a charged particle beam, amplifies an electric signal corresponding to multi-beams passed through a plurality of aperture holes of an aperture member having the plurality of aperture holes to form multi-beams by irradiation with the charged particle beam, receives the electric signal amplified in the minute current measurement unit and counting the number of electrons in the multi-beams, calculates a current quantity of the multi-beams passed through the plurality of aperture holes by using a product of the calculated number of electrons in the multi-beams and elementary charge, and corrects irradiation time of the charged particle beam of each of the plurality of aperture holes on the basis of the calculated current quantity.

10 Claims, 5 Drawing Sheets

MULTI-BEAM CURRENT QUANTITY MEASURING METHOD, MULTI-CHARGED PARTICLE DRAWING CONTROL DEVICE, AND MULTI-CHARGED PARTICLE BEAM DRAWING DEVICE

CROSS REFERENCE TO RELATED APPLICATIONS

This application is based upon and claims the benefit of priority from the prior Japanese Patent Application No. 2015-9481, filed on Jan. 21, 2015, the entire contents of which are incorporated herein by reference.

FIELD

The present invention relates to a multi-beam current quantity measuring method and a multi-charged particle beam drawing device.

BACKGROUND

A lithography technique is used to form a desired circuit pattern in a semiconductor device. In the lithography technique, patterns using an original picture pattern called reticle (which is referred to as mask as well, and hereafter referred to generally as "reticle") are transferred. At this time, an electron beam (electron ray) drawing technique having an excellent resolution is used to manufacture a high precision reticle.

As the electron beam (electron ray) drawing technique, for example, there is a drawing device using multi-beams. As compared with the case where a single electron beam is used for the drawing, the reticle can be irradiated with a large number of beams at one time by using the multi-beams. As a result, the throughput for fabricating the reticle can be improved remarkably.

In a drawing device of such a multi-beam system, for example, an electron beam emitted from an electron gun passes through an aperture member having a plurality of holes to form multi-beams. Each of the formed multi-beams is subject to blanking control. Multi-beams that are not shielded are zoomed out by an optical system, and deflected by a deflector. The deflected multi-beams are irradiated on a sample.

For securing a drawing precision, it is necessary to properly calibrate (correct) a current quantity of an electron beam. For example, in a single beam system, especially in a variable shaping system, the shot size changes by each shot. Therefore, it is suitable to adjust the current density of the electron beam so as to be uniform. On the other hand, in the multi-beam system, the shot size of the individual electron beam is fixed to the same size without conducting variable shaping unlike the single beam system. Therefore, in the multi-beam system, it becomes necessary to adjust the current quantity of each electron beam so as to be uniform.

Furthermore, in the single beam system, an area cut out as a shot from the electron beam emitted from the electron gun is small. Therefore, it is possible to make the current density in the area nearly uniform. In the multi-beam system, however, a large number of beams are cut out from a wide area. Therefore, it is difficult to implement uniformity of the current in respective currents. Therefore, it is necessary to correct the irradiation time depending on variation of current quantity in individual multi-beams.

In the case where the current quantity of the electron beam is measured, the measurement is conducted by utilizing a Faraday cup in both the single beam system and the multi-beam system described above.

In prior-art, however, the following points are not considered.

That is, when measuring the current quantity of the electron beam, especially in the case of the multi-beam system, the number of electron beams becomes enormous and consequently the current quantity of each electron beam to be measured cannot help becoming very minute. That is, in the case of the multi-beam system, the current quantity of an electron beam that has passed through each aperture hole formed through the aperture member is, for example, approximately 2 pA. After the electron beam is received by the Faraday cup, the current quantity of the electron beam is measured.

Considering that the precision demanded for the measured current quantity is for example, approximately 0.1% with respect to the setting, a micro-ammeter having a resolution of at least 0.1% of the input electron beam, i.e., 2 fA is needed.

If the resolution is 2 fA, however, noise at the time of measurement is large and it is difficult to conduct effective measurement even if a micro-ammeter is used.

Furthermore, since it is difficult to measure a minute current, it is also conceivable to, irradiate, for example, a silicon diode or the like directly with an electron beam, amplify a current, and measure the amplified current.

As the measurement is continued, however, the amplification factor is degraded. Inevitably, an individual difference of the resolution or the like of every measurement system occurs. It cannot be dissolved completely. Therefore, it is difficult to measure the absolute value of current quantity of a minute electron beam accurately with a resolution of, for example, fA order.

DETAILED DESCRIPTION

According to one embodiment, a current quantity measuring method of multi-beams, the method comprising:
irradiating with a charged particle beam;
amplifying, in a minute current measurement unit, an electric signal corresponding to multi-beams passed through a plurality of aperture holes of an aperture member having the plurality of aperture holes to form multi-beams by irradiation with the charged particle beam;

receiving, in a digitizer, the electric signal amplified in the minute current measurement unit and counting the number of electrons in the multi-beams;

calculating a current quantity of the multi-beams passed through the plurality of aperture holes by using a product of the calculated number of electrons in the multi-beams and elementary charge; and correcting, in a correction unit, irradiation time of the charged particle beam of each of the plurality of aperture holes on the basis of the calculated current quantity.

Hereafter, an embodiment of the present invention will be described with reference to the drawings.

Figure 1:
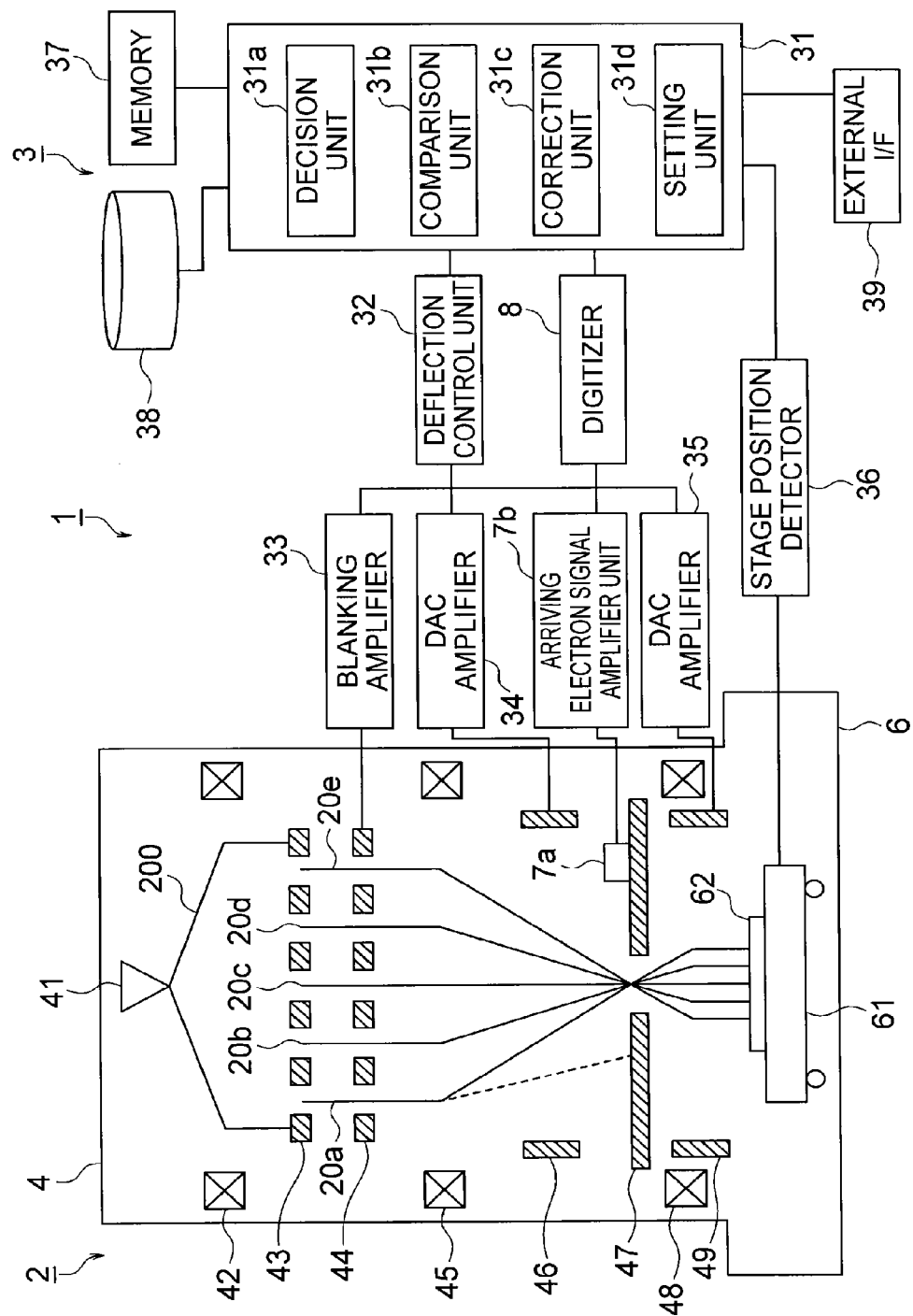
FIG. 1 is a block diagram illustrating a general configuration of a multi-charged particle beam drawing device in an embodiment of the present invention.

FIG. 1 is a block diagram illustrating a schematic configuration of a multi-charged particle beam drawing device 1 in an embodiment of the present invention. By the way, in the following embodiment, a configuration using an electron beam as an example of a charged particle beam will be described. However, the multi-charged particle beam is not limited to the electron beam, but may be a beam using charged particles such as an ion beam.

A multi-charged particle beam drawing device 1 is a device that draws a predetermined pattern on a sample, especially an example of a drawing device utilizing a multi-charged particle beam. As illustrated in FIG. 1, the multi-charged particle beam drawing device 1 includes broadly a drawing unit 2 and a control unit 3.

The drawing unit 2 includes an electron lens barrel 4 and a drawing chamber 6. In the electron lens barrel 4, an electron gun 41 is disposed. Along a light path of an electron beam emitted from the electron gun 41, an illumination lens 42, an aperture member 43, a blanking plate 44, a zoom-out lens 45, a first deflector 46, a limiting aperture member 47, an object lens 48, and a second deflector 49 are disposed in the cited order. The configuration of the aperture member 43 and the blanking plate 44 will be described later.

An electron detection unit 7a corresponding to a minute current measuring unit 7 for measuring the current quantity of the multi-charged particle beam is provided on the limiting aperture member 47. Since the electron detection unit 7a is provided in this position, the disposition place is not on an XY stage 61 described later and consequently bad influence is not exerted upon drawing processing. By the way, the minute current measuring unit 7 includes the electron detection unit 7a and an arriving electron signal amplifier unit 7b. An internal configuration of the minute current measuring unit 7 and functions of respective units will be described later.

In the embodiment of the present invention, the electron detection unit 7a is placed on the limiting aperture member 47 in a position different from a limiting aperture of the limiting aperture member 47. However, the position of the electron detection unit 7a is not limited to this. It is possible to provide a different aperture in a position different from the limiting aperture of the limiting aperture member 47 and dispose the electron detection unit 7a under such an aperture.

Furthermore, in FIG. 1, the electron detection unit 7a is provided in the illustrated position. For example, however, the electron detection unit 7a may be provided on the XY stage 61, for example, in a position apart from a disposition (placing) place of the reticle. In this position, measurement can be conducted under the same condition as the drawing.

The XY stage 61 is disposed in the drawing chamber 6. A sample 62 such as a reticle, which becomes a drawing object at the time of drawing, is disposed on the XY stage 61. The sample 62 includes a reticle for exposure used when manufacturing a semiconductor device, or a semiconductor substrate (silicon wafer) on which a semiconductor device is manufactured. Furthermore, a mask blanks coated with a resist, on which nothing is drawn yet, is included in the sample 62.

Each of the first deflector 46 and the second deflector 49 includes a plurality of electrodes such as, for example, four electrodes or eight electrodes. In FIG. 1, only one DAC amplifier is illustrated for each of the first deflector 46 and the second deflector 49. However, at least one DAC amplifier is connected to each electrode. By the way, "DAC" in the DAC amplifier is an acronym of "Digital to Analog Converter."

The control unit 3 includes a control computer 31, a deflection control unit 32, a blanking amplifier 33, deflection amplifiers (DAC amplifiers) 34 and 35, a stage position detector 36, a memory 37, a storage device 38 such as a magnetic disc device, and an external interface (I/F) circuit 39 configured to connect the multi-charged particle beam drawing device 1 to the external.

In addition, the control unit 3 includes a digitizer 8 configured to count the number of arriving electrons of a multi-beam measured in the minute current measuring unit 7. By the way, a function and an action of the digitizer 8 will be described later.

The control computer 31, the deflection control unit 32, the stage position detector 36, the memory 37, the storage device 38, the external I/F circuit 39, and the digitizer 8 are connected to each other via a bus, which is not illustrated. Furthermore, the deflection control unit 32, the blanking amplifier 33, and the DAC amplifiers 34 and 35 are connected to each other via a bus, which is not illustrated.

A decision unit 31a, a comparison unit 31b, a correction unit 31c, and a setting unit 31d are provided in the control computer 31. The decision unit 31a, the comparison unit 31b, the correction unit 31c, and the setting unit 31d may be configured by software such as a program, or may be constituted by hardware. The decision unit 31a, the comparison unit 31b, the correction unit 31c, and the setting unit 31d may be configured by a combination of software and hardware. In a case where these units are configured to include software as described above, input data, which is input to the control computer 31, or a result of computation is stored in the memory 37 each time.

The blanking amplifier 33 is connected to the blanking plate 44. The DAC amplifier 34 is connected to the first deflector 46. The DAC amplifier 35 is connected to the second deflector 49. Independent digital signals for control are output from the deflection control unit 32 to the blanking amplifier 33 and the DAC amplifiers 34 and 35, respectively.

Each of the blanking amplifier 33, and the DAC amplifiers 34 and 35 supplied with the digital signals converts the digital signal to an analog voltage signal, amplifies the analog voltage signal, and outputs a resultant signal to the connected deflector as a deflection voltage. In this way, a deflection voltage is applied to each deflector from the DAC amplifier connected to the deflector. The electron beam is deflected by such a deflection voltage.

By the way, in the multi-charged particle beam drawing device 1, four electrodes or eight electrodes of each of the first deflector 46 and the second deflector 49 are provided to surround the electron beam as described above. One pair is disposed with the electron beam between (two pairs in the case of four electrodes, and four pairs in the case of eight electrodes). DAC amplifiers are connected to each of the first deflector 46 and the second deflector 49. However, only one DAC amplifier connected to each of the first deflector 46 and the second deflector 49 is illustrated in FIG. 1, and other DAC amplifiers are not illustrated.

The stage position detector 36 is connected to the stage 61 and the control computer 31 to detect a motion of the stage 61.

Drawing data is input to the storage device 38 from the external and stored in the storage device 38.

By the way, only configurations required to describe the embodiment of the present invention are illustrated in the multi-charged particle beam drawing device 1 in the embodiment of the present invention illustrated in FIG. 1. Therefore, other configurations, for example, a control circuit configured to control each lens and so on may be added.

Figure 2:
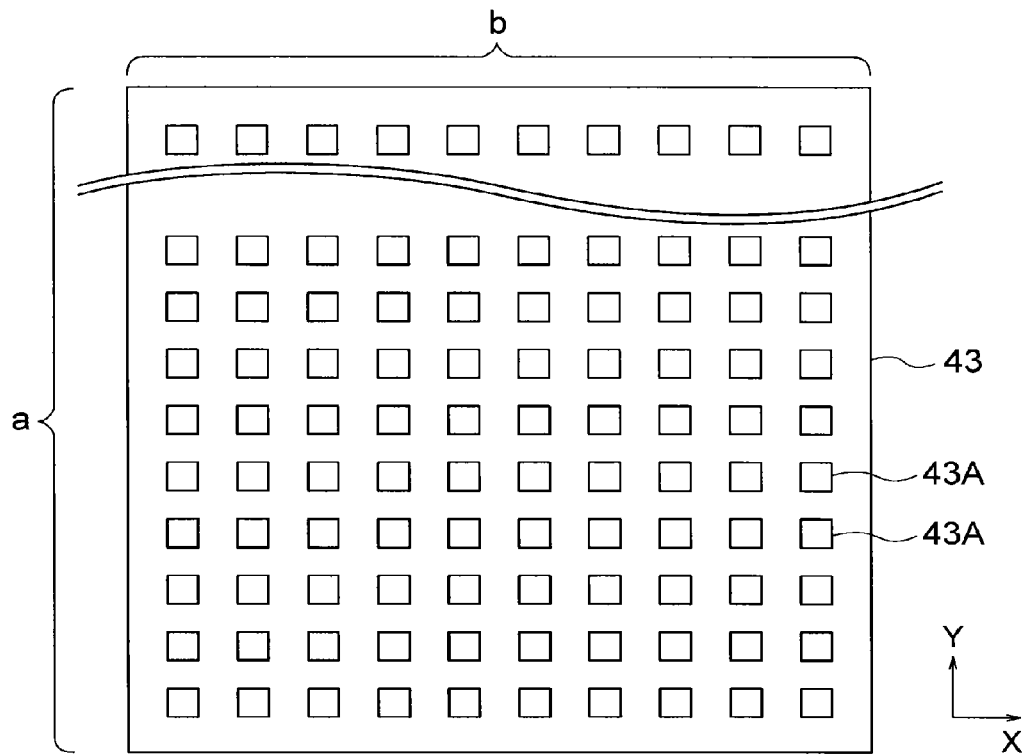
FIG. 2 is a conceptual view illustrating a configuration of an aperture member in the embodiment of the present invention.

FIG. 2 is a conceptual view illustrating a configuration of an aperture member 43 in the embodiment of the present invention. In FIG. 2, aperture holes 43A in longitudinal "a" rows (y direction) by lateral "b" rows (x direction) (where a, b≥2) are formed through the aperture member 43 in a matrix form with predetermined arrangement pitches. In FIG. 2, for example, the aperture holes 43A in 512×10 rows are formed. The aperture holes 43A are formed to become rectangles having the same dimensions and shape. Here, an example in which ten aperture holes 43A are formed in the x direction in each row in the y direction is illustrated. By the way, the aperture holes 43A may not be rectangles, but may be, for example, circle-shaped.

The entire aperture holes 43A are irradiated with the electron beam. Each of portions of the electron beam 200 passes through a plurality of aperture holes 43A. As a result, a multi-beam 20 is formed. By the way, in the multi-charged particle beam drawing device 1 in the embodiment of the present invention illustrated in FIG. 1, only five multi-beams 20 (multi-beams 20a to 20e) formed by passage of the electron beam 200 are illustrated for convenience of illustration.

Here, an example of disposing the aperture holes 43A in at least two rows both longitudinally and laterally (in y and x directions) is illustrated. However, the disposition is not restricted to this. For example, the aperture holes 43A may be arranged in a plurality of rows in one of the longitudinal and lateral directions (y and x directions) and in only one row in the other of the longitudinal and lateral directions (y and x directions).

Furthermore, the way of arranging the aperture holes 43A is not restricted to the case where the aperture holes 43A are disposed in a lattice form longitudinally and laterally as illustrated in FIG. 2. For example, aperture holes in the second row in the longitudinal direction (y direction) may be disposed with a shift of a certain specific dimension in the lateral direction (x direction) from aperture holes in the first row in the longitudinal direction (y direction). Similarly, aperture holes in the third row in the longitudinal direction (y direction) may be disposed with a shift of a certain specific dimension in the lateral direction (x direction) from aperture holes in the second row in the longitudinal direction (y direction).

Figure 3:
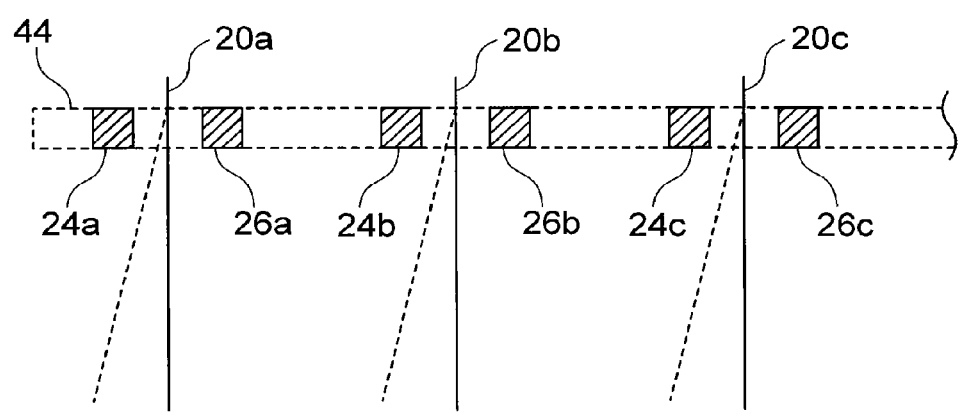
FIG. 3 is a conceptual view illustrating a configuration of a blanking plate in the embodiment of the present invention.

FIG. 3 is a conceptual view illustrating a configuration of the blanking plate 44 in the embodiment of the present invention. Passage holes are formed through the blanking plate 44 to match disposition positions of respective aperture holes 43A of the aperture member 43. A pair (blanker) of two electrodes 24 and 26 is disposed through each of the passage holes. In FIG. 3, only three pairs of electrodes 24a and 26a to 24c and 26c are illustrated by convenience of illustration.

The multi-beam 20 passing through each passage hole is deflected by a voltage applied independently to the pair of two electrodes 24 and 26, and subject to blanking control. In this way, a plurality of blankers conduct blanking deflection on respective corresponding beams among multi-beams 20 passed through the plurality of aperture holes 43A of the aperture member 43.

The multi-charged particle beam drawing device 1 operates as described below and conducts drawing on an object. The electron beam 200 emitted from the electron gun 41 illuminates the entire aperture member 43 nearly vertically by using the illumination lens 42. A plurality of rectangular aperture holes 43A are formed through the aperture member 43 as described above. The electron beam 200 illuminates an area including all of the plurality of aperture holes 43A.

Each of portions of the electron beam 200 with which positions of a plurality of aperture holes 43A are irradiated passes through a plurality of aperture holes 43A of the aperture member 43. As a result, a plurality of electron beams (multi-beams) 20a to 20e each having a shape of, for example, a rectangle are formed. The multi-beams 20a to 20e pass through inside of the corresponding blankers (electrodes 24 and 26) of the blanking plate 44, respectively. The blankers deflect the individually passing multi-beams 20 respectively (conduct blanking deflection).

The multi-beams 20a to 20e passed through the blanking plate 44 are zoomed out by the zoom-out lens 45, and proceed toward a center hole formed through the limiting aperture member 47. Here, the multi-beams 20 deflected by the blankers of the blanking plate 44 deviate in position from the center hole of the limiting aperture member 47, and is shielded by the limiting aperture member 47.

On the other hand, the multi-beams 20 that are not deflected by the blankers of the blanking plate 44 pass through the center hole of the limiting aperture member 47. Blanking control is exercised by such ON/OFF of the blankers, and ON/OFF of the multi-beams 20 is controlled.

In this way, the limiting aperture member 47 shields each beam deflected by a plurality of blankers to bring the multi-beam 20 into the OFF state. Beams of one shot are formed by the multi-beams 20 formed since the multi-beams 20 turn ON until the multi-beams turn OFF and passed through the limiting aperture member 47.

The multi-beams 20 passed through the limiting aperture member 47 are focused by the object lens 48 to form a pattern image of a desired zoom-out factor. The beams (the entire multi-beams 20) passed through the limiting aperture member 47 are deflected collectively in the same direction by the second deflector 49, and respective irradiation positions on the sample 62 of the respective beams are irradiated with the deflected beams.

Furthermore, for example, when the XY stage 61 is moving continuously, the second deflector 49 controls the irradiation positions of the beams to follow the movement of the XY stage 61. Ideally, the multi-beams 20 irradiated on the sample at one time line up with a pitch obtained by multiplying an arrangement pitch of the plurality of aperture holes 43A of the aperture member 43 by the above-described desired zoom-out factor.

The multi-charged particle beam drawing device 1 conducts the drawing operation in a raster scan manner in which irradiation with the shot beam is conducted in order consecutively. When drawing a desired pattern, beams required according to the pattern are controlled to become beam ON by blanking control.

Figure 4:
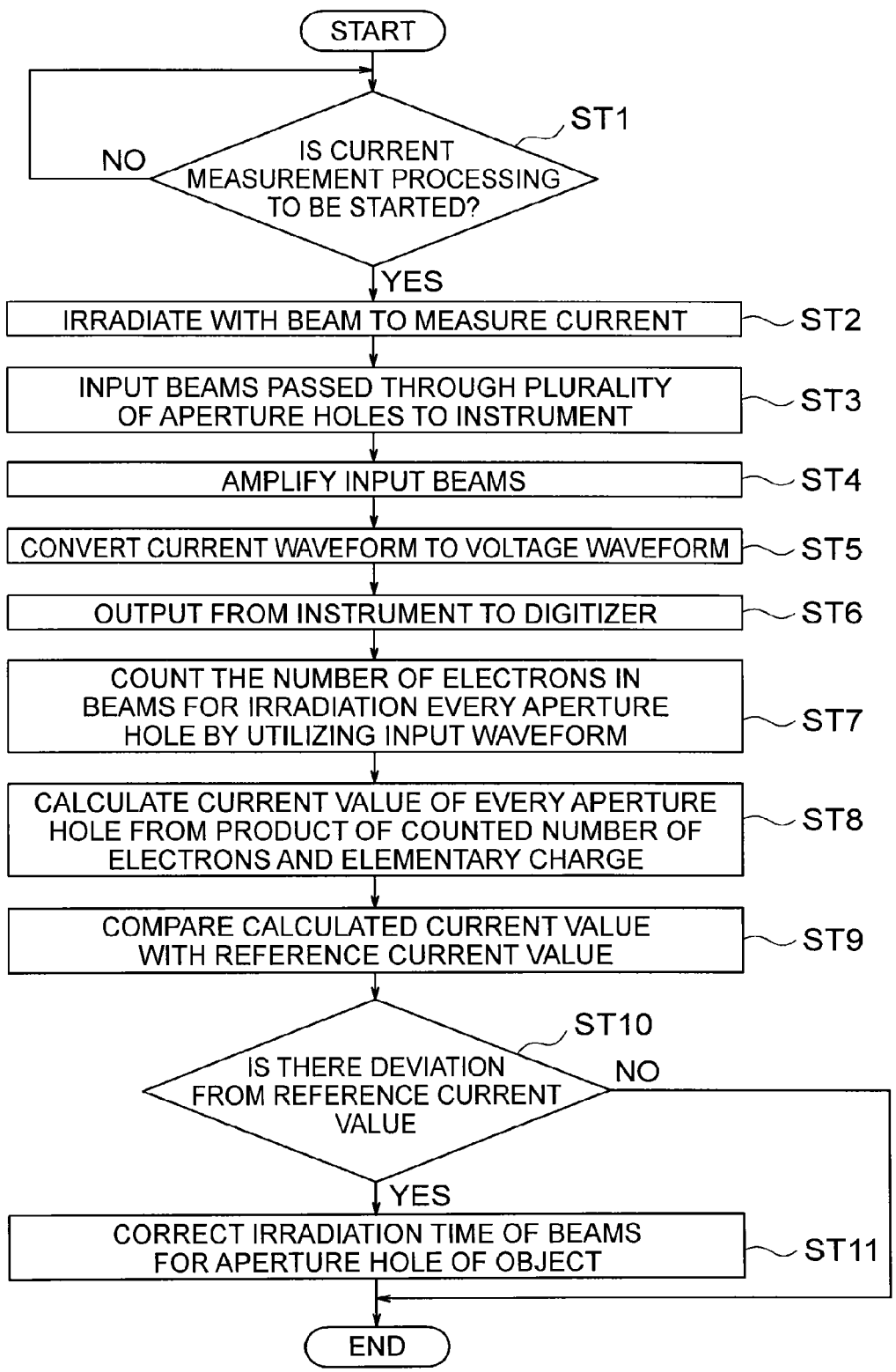
FIG. 4 is a flow chart illustrating a measurement flow of a current quantity in multi-beams in the embodiment of the present invention.

A processing flow of measurement of the current quantity of the multi-beams 20 will now be described. FIG. 4 is a flow chart illustrating a measurement processing of the current quantity of the multi-beams 20 in the embodiment of the present invention.

First, the decision unit 31a in the control computer 31 determines whether to start processing of measuring the current quantity of the multi-beams 20 (ST1). The measurement processing of the current quantity of the multi-beams 20 can be conducted, for example, before the multi-charged particle beam drawing device 1 starts drawing. In this case, for example, variation of the hole shape, blanking characteristics, distortion of the lens and so on can be reflected to actual drawing processing by conducting the measurement processing under the same condition as the drawing processing conducted thereafter. Alternatively, the measurement processing may be conducted between time when drawing processing is finished and a reticle, which is a drawing object, is conveyed and time when the next drawing processing is started. Timing of the processing start can be set arbitrarily.

In a case of a state in which the processing of measuring the current quantity of the multi-beams 20 cannot be conducted yet, waiting is conducted until timing of measurement processing start (NO in ST1).

On the other hand, in a case where measurement processing can be started (YES in ST1), the decision unit 31a instructs the electron gun 41 to emit the electron beam 200 from the electron gun 41 (ST2).

The electron beam 200 for irradiation passes through aperture holes 43A formed through the aperture member 43. A digital signal for control is input to the blanking amplifier 33 from the deflection control unit 32 on the basis of the instruction. The blanking plate 44 deflects the multi-beams 20 passed through the aperture holes 43A on the basis of the signal. The deflected multi-beams 20 are input to the minute current measuring unit 7 (ST3).

Figure 5:
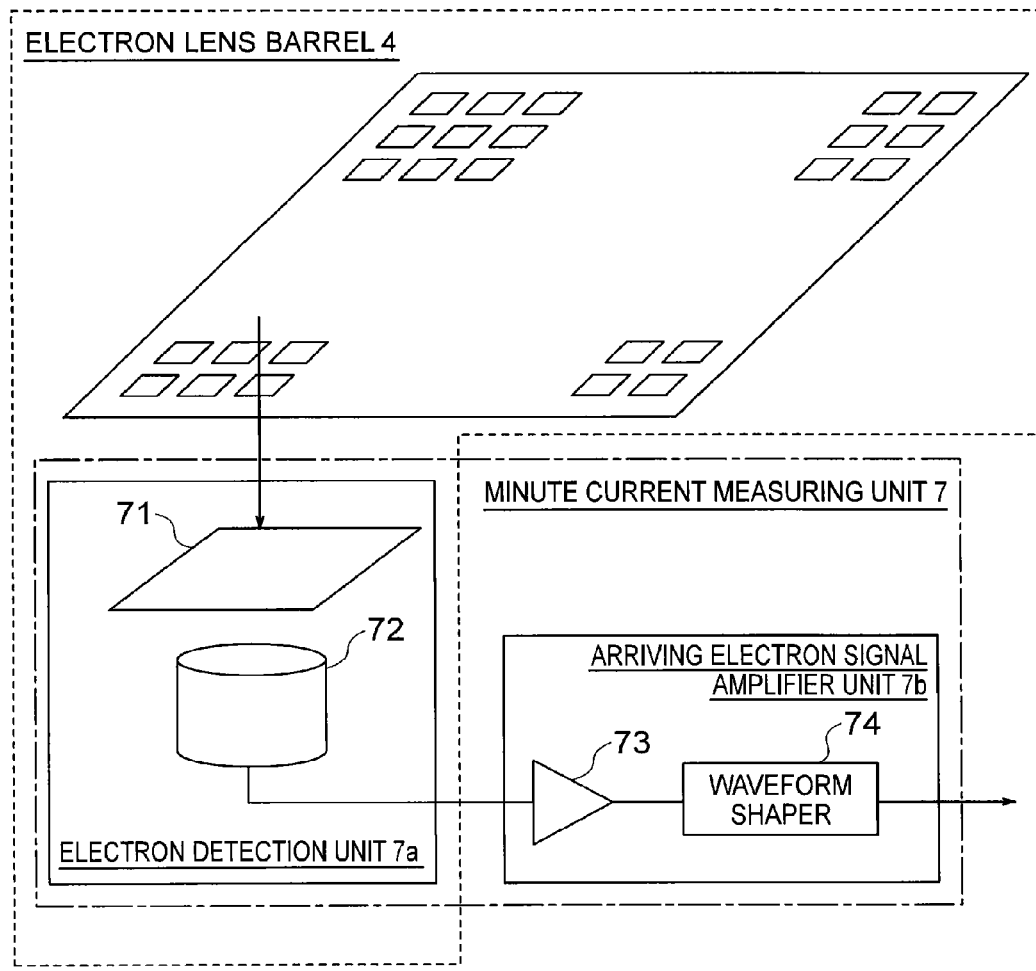
FIG. 5 is a block diagram illustrating a measurement configuration of a current quantity in multi-beams, especially an internal configuration of a minute current measuring unit in the embodiment of the present invention.

As for the minute current measuring unit 7 to which the multi-beams 20 are input, a configuration described hereafter is adopted. FIG. 5 is a block diagram illustrating a measurement configuration of a current quantity of a multi-beam 20, especially an internal configuration of the minute current measuring unit 7 in the embodiment of the present invention.

In FIG. 5, the aperture member 43 is illustrated in an upper side. The internal configuration of the minute current measuring unit 7 is illustrated in a lower side of FIG. 5. A plurality of rectangular shaped aperture holes 43A are formed through the aperture member 43 illustrated in FIG. 5 as described above. A multi-beam 20 passing through one of the aperture holes 43A is illustrated by an arrow. By the way, here, illustration of units, such as, for example, the blanking plate 44, provided between the aperture member 43 and the minute current measuring unit 7 is omitted.

The minute current measuring unit 7 includes an electron detection unit 7a including a scintillator 71 and a photomultiplier tube (PMT) 72 disposed within the electron lens barrel 4, and an arriving electron signal amplifier unit 7b including an IV amplifier 73 and a waveform shaper 74 disposed outside the electron lens barrel 4.

By the way, in FIG. 5, a state in which the electron detection unit 7a (the scintillator 71 and the photomultiplier tube 72) is provided within the electron lens barrel 4 is represented by illustrating the electron lens barrel 4 with a dashed line. Since the arriving electron signal amplifier unit 7b is disposed outside the electron lens barrel 4, the arriving electron signal amplifier unit 7b is illustrated outside the dashed line. On the other hand, in FIG. 5, the minute current measuring unit 7 is illustrated with a dot-dash line. Since the minute current measuring unit 7 includes the electron detection unit 7a and the arriving electron signal amplifier unit 7b, both the electron detection unit 7a and the arriving electron signal amplifier unit 7b are surrounded by the dot-dash line.

The scintillator 71 and the photomultiplier tube 72 detect the multi-beams 20 input to the electron detection unit 7a. In other words, the scintillator 71 and the photomultiplier tube 72 convert photo energy of the multi-beams 20 used for irradiation to electric energy, and amplify the electric energy obtained by the conversion (ST4).

By the way, in the configuration illustrated in FIG. 5, conversion to the electric energy and amplification are conducted by utilizing the above-described scintillator 71 and the photomultiplier tube 72. For example, however, a micro-channel plate (MCP), a silicon photodiode, or the like may be utilized.

The multi-beams 20 input to the minute current measuring unit 7 (the electron detection unit 7a) are converted to electric energy (electric signal) and amplified, and then input to the IV amplifier 73 included in the arriving electron signal amplifier unit 7b. In the arriving electron signal amplifier unit 7b, pre-processing for detecting the number of electrons that have arrived at the minute current measuring unit 7 from the multi-beams 20 converted to the electric signal and amplified is conducted. First, the IV amplifier 73 converts the input electric signal to a voltage signal, and amplifies the voltage signal (ST5). The reason why the current signal (current waveform) is converted to the voltage signal (voltage waveform) is that utilization of the voltage waveform is suitable for counting the number of electrons in the multi-beams 20 conducted in the digitizer 8 as described later.

Then, the voltage waveform output from the IV amplifier 73 is shaped by the waveform shaper 74 and output to the digitizer 8 (ST6).

The voltage waveform output from the minute current measuring unit 7 in this way is input to the digitizer 8. The digitizer 8 counts the number of electrons in the multi-beams 20 used for irradiation by utilizing the voltage waveform. A concrete counting method will be described hereafter.

Figure 6:
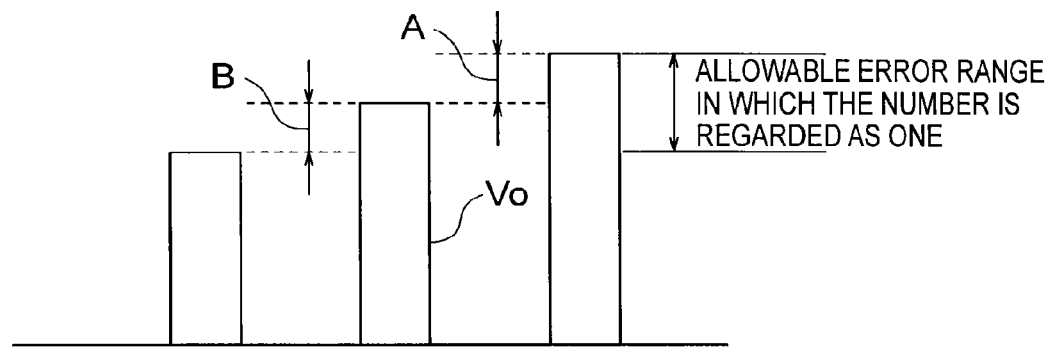
FIG. 6 is an explanation diagram illustrating a relation between a wave height value and the number of electrons in multi-beams that is one in the embodiment of the present invention.

FIG. 6 is an explanation diagram illustrating a relation between a wave height value and the number of electrons in the multi-beams that is one in the embodiment of the present invention. A voltage waveform input to the digitizer 8 is discrete data. In the embodiment of the present invention, therefore, a reference value Vo is first set in terms of a wave height value of the voltage waveform. Then, a range between +A % of the reference value Vo and −B % of the reference value Vo is set as a threshold. In a case where the value of the wave height value is in the range between +A % and −B % of the reference value Vo, the number of electrons in the multi-beams 20 is stipulated as one.

By the way, here, "+A %" or "−B %" can be set arbitrarily.

In FIG. 6, the wave height value is represented by three bar graphs. A center bar graph indicates the reference value Vo. The wave height value set as the reference value Vo represents that the number of electrons in the multi-beams 20 input to the minute current measuring unit 7 is one. If only the reference value Vo is set, however, the number of electrons in the multi-beams 20 converted to the voltage waveform cannot be measured accurately. Therefore, a threshold having a certain range above and below is set.

A bar graph on the right side of FIG. 6 indicates a wave height value that is within a range of +A % from the reference value Vo. On the other hand, a bar graph on the left side indicates a wave height value that is within a range of −B % from the reference value Vo. The number of electrons can be grasped more certainly by counting the number of electrons as one when the wave height values is within the range between +A % and −B % including the reference value Vo in this way. Therefore, it can be said that a wave height value included in the range between +A % and −B % is a value included in an allowable error range to regard the number of electrons as one.

That is, a voltage waveform indicating a wave height value of the reference value Vo is used as a basic waveform, and the number of electrons in the multi-beams 20 is counted on the basis of a product of the wave height value (reference value Vo) and time to. In other words, a product (Vo×to) of the reference value Vo indicating the reference of the height value and time 1 becomes a value indicating that the number of electrons is one. Since the time to is to be multiplied by an integer, digital processing is conducted in the counting of the number of electrons.

By the way, measurement time of the number of electrons is previously set unit time. The number of electrons per the set unit time is converted to the number of electrons per second. The number N of electrons to be used finally when calculating a current quantity is obtained in this way.

If the unit time at the time when conducting measurement is previously set, for example, it becomes unnecessary to spend a long time to measure the number of electrons of each of aperture holes 43A. As a result, the measurement can be conducted more quickly.

Figure 7:
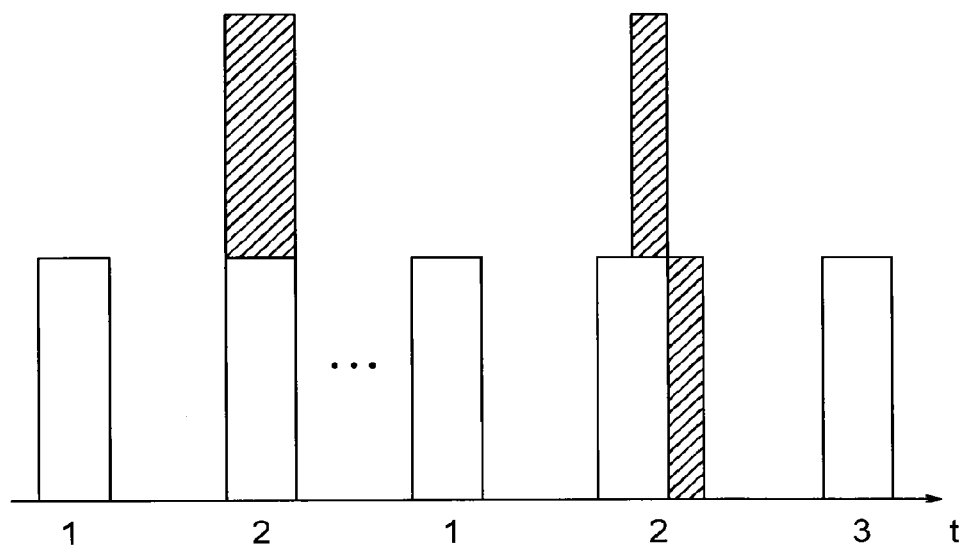
FIG. 7 is an explanation diagram illustrating a relation between a wave height value and the number of electrons in multi-beams that is one in the embodiment of the present invention.

Counting of the number of electrons in the multi-beams 20 in a case where voltage waveforms overlap will now be described. FIG. 7 is an explanation diagram illustrating a relation between the wave height value and the number of electrons in the multi-beams in the embodiment of the present invention.

In the explanation diagram illustrated in FIG. 7, right directed straight line indicates a time axis. As the position proceeds to the right, therefore, time elapses, that is, time to proceeds like 1to and 2to. Wave height values broadly indicated at 1to and 2to on the left side and wave height values indicated at 1to, 2to, and 3to on the right side represent different modes of voltage waveform overlapping, respectively.

In a case where voltage waveforms overlap, how to count the number of electrons exerts great influence upon the entire number of electrons. As the case where voltage waveforms overlap, a case where voltage waveforms each indicating a wave height value of the reference value Vo overlap in a height direction is conceivable. For example, on the left side of FIG. 7, a shaded bar graph having the same width as that of the reference value Vo is illustrated to be put on a bar graph of the reference value Vo.

Furthermore, for example, the following example is conceivable. On the right side of FIG. 7, a shaded bar graph having a width narrower than that of the reference value Vo is put on the bar graph of the reference value Vo, and a shaded bar graph having a width narrower than that of the bar graph of the reference value Vo is laid on the right side of the bar graph of the reference value Vo. In this case, the basic waveforms overlap with a shift in the time axis direction.

Denoting overlapping time of waveforms by td in these cases, the number of electrons to be found can be represented by the following expression.

$$Vo \times (to-td) + 2Vo(td) + Vo \times (to-td) \quad (1)$$

Developing Expression (1), 2(Vo×to) is obtained. In the case where overlapping of voltage waveforms occur, therefore, the digitizer 8 count the electrons as two.

The digitizer 8 counts the number of electrons in the multi-beams 20 passed through by each of the aperture holes 43A formed through the aperture member 43 (ST7). In subsequent processing, a current value is calculated, and irradiation time of the electron beam 200 is corrected on the basis of the calculated current value. The correction of the irradiation time is conducted by every aperture hole 43A. Therefore, the counted number of electrons is obtained by every aperture hole 43A.

In addition, the digitizer 8 calculates the current value of respective aperture holes 43A on the basis of the counted number of electrons of every aperture hole 43A (ST8). Specifically, the digitizer 8 calculates the current value by substituting the number of electrons into the following expression.

$$I = 1.60218E-19 \times N(A) \quad (2)$$

That is, the current value I (A) of every aperture hole 43A is calculated by multiplying the number N of electrons counted for one second by the value of the elementary charge.

By the way, in the embodiment of the present invention, the digitizer 8 conducts processing up to the counting of the number N of electrons and calculation of the current value I. For example, however, the digitizer 8 may conduct only counting of the number N of electrons and the calculation of the current value I may be conducted within the control computer 31.

The calculated current value I is output from the digitizer 8 to the control computer 31. The comparison unit 31b in the control computer 31 compares the calculated current value with a current value that becomes a reference (ST9). The current value that becomes the reference is stored in, for example, the memory 37 and the storage device 38. A predetermined current value may be previously set as the reference current value via the setting unit 31d. Alternatively, from the viewpoint of making the current value of every aperture hole 43A constant, it is possible to adopt a current value of some aperture hole 43A as the reference current value.

A result of comparison conducted in the comparison unit 31b is sent to the decision unit 31a. The decision unit 31a determines whether there is a deviation between the calculated current value and the reference current value (ST10). As for the "deviation," it may be determined that there is a deviation when a value indicating a difference between the calculated current value and the reference current value is at least a predetermined value or at most a predetermined value. Alternatively, it is possible to set values of a certain range and determine that there is a deviation in a case where the range is exceeded. Arbitrary setting via the setting unit 31d is possible.

In a case where there is a deviation as a result of decision (YES in ST10), the decision unit 31a instructs the correction unit 31c to correct the irradiation time of the electron beams for the aperture hole 43A that becomes an object. In response to the instruction from the decision unit 31a, the correction unit 31c corrects the irradiation time of the electron beam 200 so that a current quantity becomes a suitable value on the basis of a current value calculated by every aperture hole 43A (ST11). Correction of the irradiation time is calculated, for example, as described below.

That is, when it is assumed to represent a position (coordinate) of an aperture hole 43A by "a" in the longitudinal direction and "b" in the lateral direction, irradiation time (blanking off time) T of the aperture hole 43A represented by the coordinate (a, b) becomes Tab=F(Iab, Dsp). Here, "F" is a predetermined function, "I" is a current quantity calculated with respect to the aperture hole 43A having the coordinate (a, b) as described above, and "Dsp" is an irradiation setting quantity of the electron beam 200.

If the irradiation time is corrected, a dose quantity of the electron beam 200 is adjusted. Therefore, the current quantity of every aperture hole 43A can be made constant.

Information of the corrected irradiation time is applied when conducting the next drawing processing. Information of the measured current quantity is fed back accurately.

By the way, information of the corrected irradiation time may be stored in the memory 37 or the storage device 38 and referred to and reflected suitably at the time of drawing processing.

In a case where a deviation does not occur especially as a result of comparing the calculated current quantity with the reference current quantity (NO in ST10), the irradiation time of the electron beam 200 is not corrected.

As described heretofore, the current quantity of every aperture hole is calculated by first counting the number of electrons passed through the aperture hole and then multiplying the counted number of electrons by the value of the elementary charge. As a result, it is possible to provide a current quantity measuring method of multi-beams and a multi-charged particle beam drawing device capable of measuring the current quantity of the electron beam in the multi-beam system accurately with high precision and with a simple device configuration.

That is, in the conventional measurement, the current quantity is measured directly from the input electron beam by using an analog instrument. Therefore, for example, a micro-ammeter capable of measuring up to fA is used. Since the measurement precision depends upon measurement precision of the analog instrument, for example, a measurement error or the like occurs.

On the other hand, in the measuring method described in the embodiment of the present invention, multi-beams input to the minute current measuring unit are amplified and converted to a voltage waveform, and then the number of electrons is counted on the basis of the wave height value as described above. The number of electrons that is one is found from the reference value based on the wave height value. In addition, upper and lower thresholds are provided on the basis of the reference value and a wave height value included between the thresholds is also grasped as the number of electrons that is one. Therefore, it is possible to absorb an error of resolution of signal intensity at the time when an analog instrument is used.

Data corresponding to one electron is handled as discrete data, the number of electrons is counted in a digital form, and the current quantity is found by multiplying the counted number of electrons by the elementary charge. In order to determine whether there is an electron and measuring the number of electrons in the multi-beams input to the minute current measuring unit, therefore, it suffices to have a resolution of the signal intensity capable of discriminating an integer times of the elementary charge. This means that the minute current measuring unit may also have a resolution as compared with the case the current quantity of the multi-beams is measured directly by utilizing an analog instrument as in the conventional technique. In terms of the resolution of the signal intensity, in the above-described measuring method, an ordinary measurement device can cope with sufficiently in this way.

Temporal resolution will now be described. For example, in a case where it is attempted to measure a current quantity of 2 pA, the number of electrons input to the minute current measuring unit by irradiation with multi-beams becomes, for example, 12.5 million (M) per second. Therefore, it suffices to utilize the minute current measuring unit and the digitizer having a temporal resolution of approximately 25 MHz. It is considered that ordinary devices satisfy this condition in many cases. In terms of the temporal resolution as well, therefore, it can be said that the measuring method of the current quantity described in the embodiment of the present invention is effective.

If it is not necessary that the minute current measuring unit and the digitizer used when grasping the current quantity of the multi-beams are special devices, but ordinary devices can be used, or measurement can be conducted with loose precision as compared with the conventional technique, measurement can be conducted more simply and accurately as compared with the case where the current quantity of the multi-beams is actually measured directly as the current quantity. If accurate and precise measurement of the current quantity can be conducted, it becomes possible to conduct the correction of the irradiation time as well. As a result, it becomes possible to control the irradiation quantity on the sample with electrons accurately. Therefore, the drawing precision is improved, and eventually the throughput of the drawing processing is improved.

In addition, in a case where measurement utilizing an analog instrument is conducted, especially in a case where measurement is conducted by using a wave height value, there is a possibility that a detected value will change due to degradation or the like of the instrument. On the other hand, in the measuring method in the present invention, digital measurement is conducted and thresholds are provided to include the reference value as described above. Even if a measurement error occurs, therefore, influence as in analog measurement is hard to appear. Even if degradation with time occurs in the minute current measuring unit, therefore, measurement can be conducted for a long time by conducting correction suitably. Eventually, it is possible to prolong time for which stable drawing processing utilizing the multi-charged particle beam drawing device is conducted.

Furthermore, even if degradation occurs in the minute current measuring unit due to a change with time, it becomes possible to cause the minute current measuring unit to recognize the number of electrons in the multi-beams by properly changing the value of the number of electrons grasped (wave height value Vo). In terms of the current quantity measurement processing of the multi-beams utilizing the minute current measuring unit, therefore, the measurement precision can be maintained for a long time. As a result, it is possible to stabilize the measured value and it becomes possible to prolong the exchange time of the minute current measuring unit itself.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A current quantity measuring method of multi-beams, the method comprising:
  irradiating with a charged particle beam;
  converting, in a minute current measurement unit, multi-beams passed through a plurality of aperture holes of an aperture member having the plurality of aperture holes for forming the multi-beams by irradiation with the charged particle beam, into an electric signal, and then amplifying the electric signal;

receiving, in a digitizer, the electric signal amplified in the minute current measurement unit and counting the number of electrons in the multi-beams;

calculating a current quantity of the multi-beams passed through the plurality of aperture holes by using a product of the calculated number of electrons in the multi-beams and elementary charge; and correcting, in a correction unit, irradiation time of the charged particle beam of each of the plurality of aperture holes on the basis of the calculated current quantity.

2. The current quantity measuring method according to claim 1, wherein, in counting the number of electrons in the multi-beams, a reference value for a wave height value of the signal input to the digitizer is provided previously, and in a case where the wave height value is within a range between thresholds including the reference value, the number of electrons in the multi-beams is counted as one.

3. The current quantity measuring method according to claim 2, comprising:

converting the input signal to a voltage signal after amplifying the electric signal corresponding to the multi-beams, wherein the voltage signal is input to the digitizer.

4. The current quantity measuring method according to claim 3, wherein in counting the number of electrons in the multi-beams, the number of electrons in charged particle beams passed through a corresponding aperture hole is counted by each of the plurality of aperture holes.

5. A multi-charged particle beam drawing control device comprising:

a minute current measuring unit to convert multi-beams passed through a plurality of aperture holes of an aperture member having the plurality of aperture holes for forming the multi-beams by irradiation with the charged particle beam, into an electric signal, and then to amplify the electric signal;

a digitizer to receive the electric signal amplified in the minute current measurement unit, counting the number of electrons in the multi-beams by each of the plurality of apertures, and calculating a current quantity of the multi-beams passed through the plurality of aperture holes by using a product of the calculated number of electrons in the multi-beams and elementary charge; and a correction unit configured to correct irradiation time of the charged particle beam of every one of the plurality of aperture holes on the basis of the calculated current quantity.

6. The multi-charged particle beam drawing control device according to claim 5, wherein in the counting of the number of electrons in the multi-beams, a reference value for a wave height value of the signal input to the digitizer is provided previously, and in a case where the wave height value is within a range between thresholds including the reference value, the number of electrons in the multi-beams is counted as one.

7. The multi-charge particle beam drawing control device according to claim 6, wherein the minute current measuring unit comprises a converter configured to convert the input signal to a voltage signal, and the voltage signal is input to the digitizer.

8. A multi-charge particle beam drawing device comprising:

a stage to mount a sample and to be moved consecutively;

an emitter to emit a charged particle beam;

an aperture member having a plurality of aperture holes by irradiating an area including all the aperture holes with the charged particle beam so that the charged particle beam passes through the aperture holes to form multi beams;

a blanking plate having a plurality of blankers, each blanker conducting blanking control of the corresponding beam in the multi-beams passed through the plurality of aperture holes;

a minute current measurement unit to convert the multi-beams passed through the plurality of aperture holes in the blanking plate, into an electric signal, and then to amplify the electric signal;

a digitizer to receive the electric signal amplified in the minute current measurement unit, counting the number of electrons in the multi-beams by every one of the plurality of apertures, and calculating a current quantity of the multi-beams passed through the plurality of aperture holes by using a product of the calculated number of electrons in the multi-beams and elementary charge; and a correction unit to correct irradiation time of the charged particle beam by every one of the plurality of aperture holes on the basis of the calculated current quantity.

9. The multi-charged particle beam drawing device according to claim 8, wherein in the counting of the number of electrons in the multi-beams, a reference value for a wave height value of the signal input to the digitizer is provided previously, and in a case where the wave height value is within a range between thresholds including the reference value, the number of electrons in the multi-beams is counted as one.

10. The multi-charged particle beam drawing device according to claim 9, wherein the minute current measuring unit comprises a converter to convert the electric signal to a voltage signal, and the voltage signal is input to the digitizer, the digitizer calculating the number of electrons by every one of the plurality of aperture holes based on the voltage signal.

* * * * *